United States Patent [19]
Morikawa

[11] Patent Number: 5,793,060
[45] Date of Patent: Aug. 11, 1998

[54] SOI OPTICAL SEMICONDUCTOR DEVICE

[75] Inventor: Takenori Morikawa, Tokyo, Japan

[73] Assignee: NEC Corporation, Japan

[21] Appl. No.: 840,975

[22] Filed: Apr. 21, 1997

[30] Foreign Application Priority Data

Apr. 25, 1996 [JP] Japan .................. 8-105600

[51] Int. Cl.$^6$ .................. H01L 27/14; H01L 27/15; H01L 31/12
[52] U.S. Cl. .................. 257/85; 257/21; 257/436; 257/446
[58] Field of Search .................. 257/21, 80, 84, 257/85, 436, 446

[56] References Cited

U.S. PATENT DOCUMENTS 5,629,534  5/1997  Inuzuka et al. .................. 257/84

FOREIGN PATENT DOCUMENTS 6266668  3/1987  Japan .................. H01L 27/15

OTHER PUBLICATIONS

"Room-temperature 1.3um electroluminescence from strained $Si_{1-x}Ge_xSi$ quantum wells" Q. Mi et al Applied Physics Letters, vol. 60, No. 25, Jun. 1992, pp. 3177–3179.

Primary Examiner—Olik Chaudhuri
Assistant Examiner—John Guay
Attorney, Agent, or Firm—Hayes, Soloway, Hennessey, Grossman & Hage, P.C.

[57] ABSTRACT

There is provided an optical semiconductor device, including a first semiconductor layer, a first insulating layer formed on the first semiconductor layer, the first insulating layer having a different index of refraction from that of the first semiconductor layer, a highly doped, second semiconductor layer formed on the first insulating layer, a third semiconductor layer formed on the second semiconductor layer, a device isolation region having a depth starting at an upper surface of the third semiconductor layer and terminating at an upper surface of the first insulating layer, the device isolation region defining a device formation region therein, the device formation region being formed with a recess starting at an upper surface of the third semiconductor layer and terminating at an upper surface of the second semiconductor layer, a second insulating layer covering an inner sidewall of the recess therewith, a multi-layered structure formed within the recess, the multi-layered structure having at least a quantum well layer and a contact layer, a connection region having a depth starting at an upper surface of the third semiconductor layer and terminating at an upper surface of the second semiconductor layer, a first electrode formed on the connection region, a second electrode formed on the contact layer, and a light-impermeable region having a depth starting at an upper surface of the third semiconductor layer and terminating at an upper surface of the first insulating layer, the light-impermeable region being formed outside the recess. The optical semiconductor device can be fabricated in a planar structure, and has an improved photoelectric transfer efficiency. The optical semiconductor device makes it possible to integrate a light-emitting device and a light-receiving device on a common chip with the devices being optically insulated from each other.

16 Claims, 8 Drawing Sheets

SOI OPTICAL SEMICONDUCTOR DEVICE

BACKGROUND OF THE INVENTION

1. Field of the Invention

The invention relates to an optical semiconductor device to be fabricated employing an SOI substrate, and more particularly to a plane-type optical semiconductor device such as a plane-type light-emitting device and a plane-type light-receiving device which is capable of emitting or receiving a light perpendicularly to a plane of an SOI substrate.

2. Description of the Related Art

As an integrated circuit to be used for optical communication, there has been used optical transmission and reception modules employing III–V compounds and an transceiver for optical communication. For instance, there has been used an optical communication module having a silicon IC mounted therein which includes an InGaAsP/InP laser diode (LD) chip and a circuit for driving the chip, and an optical communication module having a silicon IC mounted thereon which includes an InGaAs/InP Pin photo diode (PD) chip and a signal amplifier. There has been also used a transceiver for optical communication having a silicon IC mounted therein which includes a LD chip, a PD chip, a driver circuit for optical transmission, and a amplifying circuit for optical reception.

In order to reduce fabrication costs, it is desired to be able to apply silicon process to the above mentioned devices. Thus, optical devices employing SiGe has been researched and studied in order to accomplish Si-OEIC having LD, PD and IC all of which are integrally formed in a single device.

For instance, there has been reported electricity-light transfer at room temperature (RT) in a mesa-type diode having a Si/SiGe super lattice layer formed on a silicon substrate in "Room-temperature 1.3 μm electroluminescence from strained $Si_{1-x}Ge_x$/Si quantum wells", Q. Mi et al., Applied Physics Letters, Vol. 60, No. 25, June 1992, pp. 3177–3179.

For another instance, Japanese Unexamined Patent Publication No. 62-66668 has suggested Si-OEIC wherein an integrated circuit and a laser diode, a photo diode or a photo transistor having a Si/SiGe super lattice layer are formed on a common substrate.

Those suggested devices are fabricated by forming a super lattice structure having alternately deposited Si and SiGe layers by growth as a light transmission section or a light reception section, forming a highly doped layer by growth which will make an electrode, and etching in a mesa-configuration. By employing a super lattice structure, it is possible to increase a total thickness of light absorption layers made of SiGe with the result of improvement in electricity-light transfer efficiency.

Figure 1:
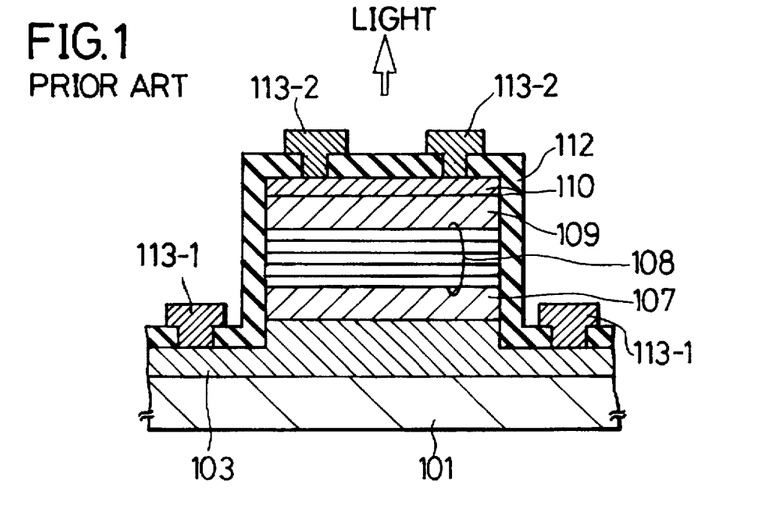
FIG. 1 is a cross-sectional view illustrating a conventional light-emitting device.

FIG. 1 is a cross-sectional view illustrating a device used by Q. Mi et al. for measurement of electricity-light transfer in a light emitting device. The illustrated device is fabricated by the steps of forming an N+ type epitaxial layer 103 by growth on an N type silicon substrate 101, forming a non-doped silicon epitaxial layer 107, a $Si/Si_{0.65}Ge_{0.35}$ super lattice layer 108, a non-doped silicon buffer layer 109 and a P+ type contact layer 110 on the N+ type epitaxial layer 103 on this order, etching a resultant in mesa-configuration so that the N+ type epitaxial layer 103 is partially etched in thickness-wise direction thereof, covering a resultant with a silicon dioxide film 112, forming holes at P and N regions with the silicon dioxide film 112, and forming electrodes 113-1 and 113-2 on the P and N regions, respectively. Thus, there is completed a diode. The illustrated device or diode would perform electricity-light transfer to thereby emit lights having a wavelength of 1.3 μm when a pn junction thereof is forward-biased.

Figure 2:
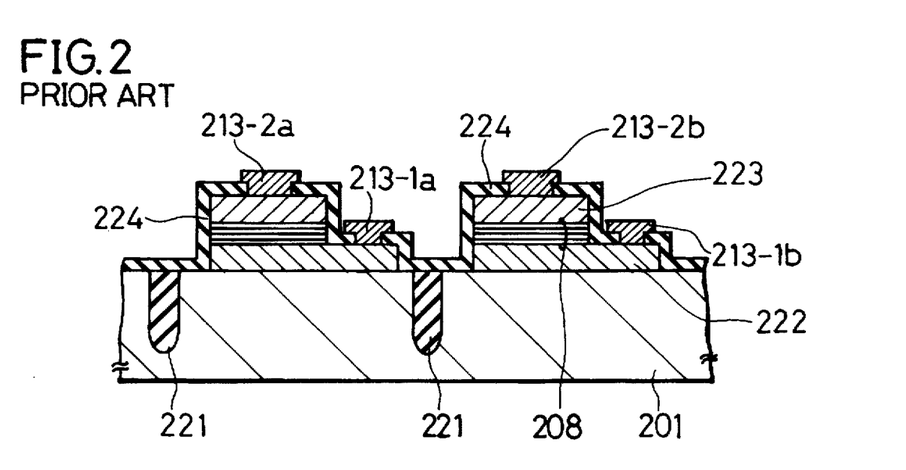
FIG. 2 is a cross-sectional view illustrating a conventional optical integrated circuit.

FIG. 2 is a cross-sectional view illustrating a light emission section and a light receiving section in Si-OEIC suggested in the above mentioned Japanese Unexamined Patent Publication No. 62-66668. The illustrated device is fabricated by the steps of forming an N type silicon layer 222, an Si/SiGe super lattice layer 208 and a p-type silicon layer 223 by successive growth on a silicon substrate 201, etching the layers 223, 208, 222 in mesa-configuration, further etching the silicon substrate 201 for separating the light emission section and the light reception section from each other, filling holes, which were formed by etching, with silicon dioxide to thereby form device isolation regions 221 in the silicon substrate 201, covering a resultant with a silicon nitride film 224, forming lower electrodes 213-1a and 213-1b on and in electrical connection with the N type silicon layers 222, and forming upper electrodes 213-2a and 213-2b on and in electrical connection with the p-type silicon layer 223.

The conventional devices illustrated in FIGS. 1 and 2 have problems as follows. The light emitting device suggested by Q. Mi et al. (FIG. 1) has a problem that it cannot provide a light emission efficiency expected to have in general plane-type light emitting devices. The reason is that there is only provided the N+ type silicon layer 103 below the $Si/Si_{0.65}Ge_{0.35}$ super lattice layer 108, and hence the N+ type silicon layer 103 cannot sufficiently act as a reflection layer.

In addition, since the above mentioned light emitting and receiving devices as illustrated in FIGS. 1 and 2 are configured in mesa-type, it is unavoidable that there are formed large steps on a silicon substrate. Such large steps make it difficult to form internal circuits together with the light emitting and receiving devices on a common chip. The reason is as follows. It is preferable for transistors used for internal circuits to have a planar structure, because integration would be accomplished relatively readily. However, if transistors are to be fabricated to have a planar structure, it would be quite difficult to form the planar type transistors and the mesa type light emitting and receiving devices by the same fabrication process.

SUMMARY OF THE INVENTION

It is an object of the present invention to provide a planar type optical semiconductor device having an improved electricity-light and/or light-electricity transfer efficiency.

Another object of the present invention is to provide a planar type optical semiconductor device which is capable of integrating light emitting and receiving devices on a common chip with the devices being optically insulated from each other.

In one aspect, there is provided an optical semiconductor device, including (a) a first semiconductor layer, (b) a first insulating layer formed on the first semiconductor layer, the first insulating layer having a different index of refraction from that of the first semiconductor layer, (c) a highly doped, second semiconductor layer having a first conductivity and formed on the first insulating layer, (d) a third semiconductor layer having a first conductivity and formed on the second semiconductor layer, (e) a device isolation region having a depth starting at an upper surface of the third semiconductor layer and terminating at an upper surface of the first insulating layer, the device isolation region defining a device formation region therein, the device formation region being formed with a recess starting at an upper surface of the third semiconductor layer and terminating at an upper surface of the second semiconductor layer, (f) a multi-layered structure formed within the recess, the multi-layered structure having at least a quantum well layer and a contact layer formed on the quantum well layer and having a second conductivity, (g) a connection region having a depth starting at an upper surface of the third semiconductor layer and terminating at an upper surface of the second semiconductor layer, (h) a first electrode formed on and in electrical connection with the connection region, and (i) a second electrode formed on and in electrical connection with the contact layer.

The above mentioned optical semiconductor device may further include a second insulating layer covering an inner sidewall of the recess therewith. The above mentioned optical semiconductor device may further include a light-impermeable region having a depth starting at an upper surface of the third semiconductor layer and terminating at an upper surface of the first insulating layer, the light-impermeable region being formed outside the recess.

There is further provided an optical semiconductor device, including (a) a first semiconductor layer, (b) a highly doped, second semiconductor layer having a first conductivity and formed on the first semiconductor layer, (c) a third semiconductor layer having a first conductivity and formed on the second semiconductor layer, (d) a device isolation region having a depth starting at an upper surface of the third semiconductor layer and terminating at an upper surface of the first semiconductor layer, the device isolation region defining a device formation region therein, the device formation region being formed with a recess starting at an upper surface of the third semiconductor layer and terminating at an upper surface of the second semiconductor layer, (e) a second insulating layer covering an inner sidewall of the recess therewith, (f) a multi-layered structure formed within the recess, the multi-layered structure having at least a quantum well layer and a contact layer formed on the quantum well layer and having a second conductivity, (g) a connection region having a depth starting at an upper surface of the third semiconductor layer and terminating at an upper surface of the second semiconductor layer, (h) a first electrode formed on and in electrical connection with the connection region, and (i) a second electrode formed on and in electrical connection with the contact layer.

The above mentioned optical semiconductor may further include a light-impermeable region having a depth starting at an upper surface of the third semiconductor layer and terminating at an upper surface of the first semiconductor layer, the light-impermeable region being formed outside the recess.

There is still further provided an optical semiconductor device, including (a) a first semiconductor layer, (b) a highly doped, second semiconductor layer having a first conductivity and formed on the first semiconductor layer, (c) a third semiconductor layer having a first conductivity and formed on the second semiconductor layer, (d) a device isolation region having a depth starting at an upper surface of the third semiconductor layer and terminating at an upper surface of the first semiconductor layer, the device isolation region defining a device formation region therein, the device formation region being formed with a recess starting at an upper surface of the third semiconductor layer and terminating at an upper surface of the second semiconductor layer, (e) a multi-layered structure formed within the recess, the multi-layered structure having at least a quantum well layer and a contact layer formed on the quantum well layer and having a second conductivity, (f) a connection region having a depth starting at an upper surface of the third semiconductor layer and terminating at an upper surface of the second semiconductor layer, (g) a first electrode formed on and in electrical connection with the connection region, (h) a second electrode formed on and in electrical connection with the contact layer, and (i) a light-impermeable region having a depth starting at an upper surface of the third semiconductor layer and terminating at an upper surface of the first semiconductor layer, the light-impermeable region being formed outside the recess.

There is yet further provided an optical semiconductor device, including (a) a first semiconductor layer, (b) a first insulating layer formed on the first semiconductor layer, the first insulating layer having a different index of refraction from that of the first semiconductor layer, (c) a highly doped, second semiconductor layer having a first conductivity and formed on the first insulating layer, (d) a third semiconductor layer having a first conductivity and formed on the second semiconductor layer, (e) a device isolation region having a depth starting at an upper surface of the third semiconductor layer and terminating at an upper surface of the first insulating layer, the device isolation region defining a device formation region therein, the device formation region being formed with a recess starting at an upper surface of the third semiconductor layer and terminating at an upper surface of the second semiconductor layer, (f) a second insulating layer covering an inner sidewall of the recess therewith, (g) a multi-layered structure formed within the recess, the multi-layered structure having at least a quantum well layer and a contact layer formed on the quantum well layer and having a second conductivity, (h) a connection region having a depth starting at an upper surface of the third semiconductor layer and terminating at an upper surface of the second semiconductor layer, (i) a first electrode formed on and in electrical connection with the connection region, (j) a second electrode formed on and in electrical connection with the contact layer, and (k) a light-impermeable region having a depth starting at an upper surface of the third semiconductor layer and terminating at an upper surface of the first insulating layer, the light-impermeable region being formed outside the recess.

The optical semiconductor device may further include a first buffer layer sandwiched between the second semiconductor layer and the quantum well layer, and a second buffer layer sandwiched between the quantum well layer and the contact layer.

The first insulating layer may have a thickness determined in dependence on reflectance against the second semiconductor layer with respect to a light having a wavelength associated with the quantum well layer. The first insulating layer has a thickness preferably in the range of 0.15 μm to 0.30 μm both inclusive, and more preferably in the range of 0.20 μm to 0.25 μm both inclusive.

The first insulating layer may be formed all over the first semiconductor layer, or may be partially formed over the first semiconductor layer in which case it is preferable that the first insulating layer is formed at least below the multi-layered structure.

The optical semiconductor device may further include a third insulating layer covering a resultant therewith, in which case the first and second electrodes appear outside through the third insulating layer. The third insulating layer has a thickness preferably in the range of 0.15 μm to 0.30 μm both inclusive, and more preferably in the range of 0.20 μm to 0.25 μm both inclusive.

The quantum well layer may be formed of a $Si_{1-x}Ge_x/Si$ super lattice layer (0<x<1).

The light-impermeable region may be formed outside the device formation region or inside the device formation region. In the latter case, it is preferable that the light-impermeable region is made of metal to act as a connection region, in which case the connection region does not need to be formed. It is preferable that the light-impermeable region is made of refractory metal such as tungsten.

The above mentioned optical semiconductor device may be used as a light emitting device or a light-receiving device. If forward-biased, the optical semiconductor device acts as a light-emitting device, whereas if reverse-biased, the optical semiconductor device acts as a light-receiving device.

In another aspect, there is provided a method of fabricating an optical semiconductor device, including the steps of (a) forming a first insulating layer on a first semiconductor layer, the first insulating layer having a different index of refraction from that of the first semiconductor layer, (b) forming a highly doped, second semiconductor layer on the first insulating layer, the second semiconductor layer having a first conductivity, (c) forming a third semiconductor layer on the second semiconductor layer, the third semiconductor layer having a first conductivity, (d) forming a device isolation region having a depth starting at an upper surface of the third semiconductor layer and terminating at an upper surface of the first insulating layer, the device isolation region defining a device formation region therein, (e) forming a connection region having a depth starting at an upper surface of the third semiconductor layer and terminating at an upper surface of the second semiconductor layer, (f) forming a recess within the device formation region, the recess starting at an upper surface of the third semiconductor layer and terminating at an upper surface of the second semiconductor layer, (g) forming a multi-layered structure in the recess, the multi-layered structure having at least a quantum well layer and a contact layer formed on the quantum well layer and having a second conductivity, (h) forming a first electrode on and in electrical connection with the connection region, and (i) forming a second electrode on and in electrical connection with the contact layer.

The above mentioned method may further include the step (j) of forming a second insulating layer covering an inner sidewall of the recess therewith. The step (j) is carried out between the steps (f) and (g).

The above mentioned method may further include the step (k) of forming a light-impermeable region having a depth starting at an upper surface of the third semiconductor layer and terminating at an upper surface of the first insulating layer, the light-impermeable region being formed outside the recess.

There is further provided a method of fabricating an optical semiconductor device, including the steps of (a) forming a highly doped, second semiconductor layer on a first semiconductor layer, the second semiconductor layer having a first conductivity, (b) forming a third semiconductor layer on the second semiconductor layer, the third semiconductor layer having a first conductivity, (c) forming a device isolation region having a depth starting at an upper surface of the third semiconductor layer and terminating at an upper surface of the first semiconductor layer, the device isolation region defining a device formation region therein, (d) forming a connection region having a depth starting at an upper surface of the third semiconductor layer and terminating at an upper surface of the second semiconductor layer, (e) forming a recess within the device formation region, the recess starting at an upper surface of the third semiconductor layer and terminating at an upper surface of the second semiconductor layer, (f) forming a second insulating layer covering an inner sidewall of the recess therewith, (g) forming a multi-layered structure in the recess, the multi-layered structure having at least a quantum well layer and a contact layer formed on the quantum well layer and having a second conductivity, (h) forming a first electrode on and in electrical connection with the connection region, and (i) forming a second electrode on and in electrical connection with the contact layer.

The above mentioned method may further include the step of (j) of forming a light-impermeable region having a depth starting at an upper surface of the third semiconductor layer and terminating at an upper surface of the first semiconductor layer, the light-impermeable region being formed outside the recess.

There is still further provided a method of fabricating an optical semiconductor device, including the steps of (a) forming a highly doped, second semiconductor layer on a first semiconductor layer, the second semiconductor layer having a first conductivity, (b) forming a third semiconductor layer on the second semiconductor layer, the third semiconductor layer having a first conductivity, (c) forming a device isolation region having a depth starting at an upper surface of the third semiconductor layer and terminating at an upper surface of the first semiconductor layer, the device isolation region defining a device formation region therein, (d) forming a connection region having a depth starting at an upper surface of the third semiconductor layer and terminating at an upper surface of the second semiconductor layer, (e) forming a recess within the device formation region, the recess starting at an upper surface of the third semiconductor layer and terminating at an upper surface of the second semiconductor layer, (f) forming a multi-layered structure in the recess, the multi-layered structure having at least a quantum well layer and a contact layer formed on the quantum well layer and having a second conductivity, (g) forming a light-impermeable region having a depth starting at an upper surface of the third semiconductor layer and terminating at an upper surface of the first semiconductor layer, the light-impermeable region being formed outside the recess, (h) forming a first electrode on and in electrical connection with the connection region, and (i) forming a second electrode on and in electrical connection with the contact layer.

There is yet further provided a method of fabricating an optical semiconductor device, including the steps of (a) forming a first insulating layer on a first semiconductor layer, the first insulating layer having a different index of refraction from that of the first semiconductor layer, (b) forming a highly doped, second semiconductor layer on the first insulating layer, the second semiconductor layer having a first conductivity, (c) forming a third semiconductor layer on the second semiconductor layer, the third semiconductor layer having a first conductivity, (d) forming a device isolation region having a depth starting at an upper surface of the third semiconductor layer and terminating at an upper surface of the first insulating layer, the device isolation region defining a device formation region therein, (e) forming a connection region having a depth starting at an upper surface of the third semiconductor layer and terminating at an upper surface of the second semiconductor layer, (f) forming a recess within the device formation region, the recess starting at an upper surface of the third semiconductor layer and terminating at an upper surface of the second semiconductor layer, (g) forming a second insulating layer covering an inner sidewall of the recess therewith, (h) forming a multi-layered structure in the recess, the multi-layered structure having at least a quantum well layer and a contact layer formed on the quantum well layer and having a second conductivity, (i) forming a light-impermeable region having a depth starting at an upper surface of the third semiconductor layer and terminating at an upper surface of the first insulating layer, the light-impermeable region being formed outside the recess, (j) forming a first electrode on and in electrical connection with the connection region, and (k) forming a second electrode on and in electrical connection with the contact layer.

The above mentioned method may further include the step of covering a resultant with a third insulating layer, in which case first and second electrodes appear outside through the third insulating layer. The third insulating layer has a thickness preferably in the range of 0.20 μm to 0.25 μm both inclusive.

In the above mentioned optical semiconductor device, there is formed a recess in the third semiconductor layer in the device formation region defined by the device isolation region, and then an inner sidewall of the recess is covered with the second insulating layer followed by the formation of the multi-layered structure in the recess. The first electrode is formed on the connection region, and the second electrode is formed on the multi-layered structure. Thus, both the first and second electrodes can be formed at a surface of a substrate in accordance with the present invention.

In the above mentioned optical semiconductor device, there is formed the first insulating layer sandwiched between the semiconductor substrate and the second semiconductor layer. Since the first insulating layer is formed at least below the multi-layered structure including the quantum well layer, the first insulating layer acts as a reflection layer, and hence it is possible to improve an electricity-light transfer efficiency in the optical semiconductor device.

In the above mentioned optical semiconductor device, there is formed the light-impermeable region outside the recess. The light-impermeable region avoids light reflection between a sidewall of the multi-layered structure and other devices formed on a common chip. Thus, the light-impermeable region provides greater light reflection efficiency, resulting in improvement in an electricity-light transfer efficiency in the optical semiconductor device.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 3A:
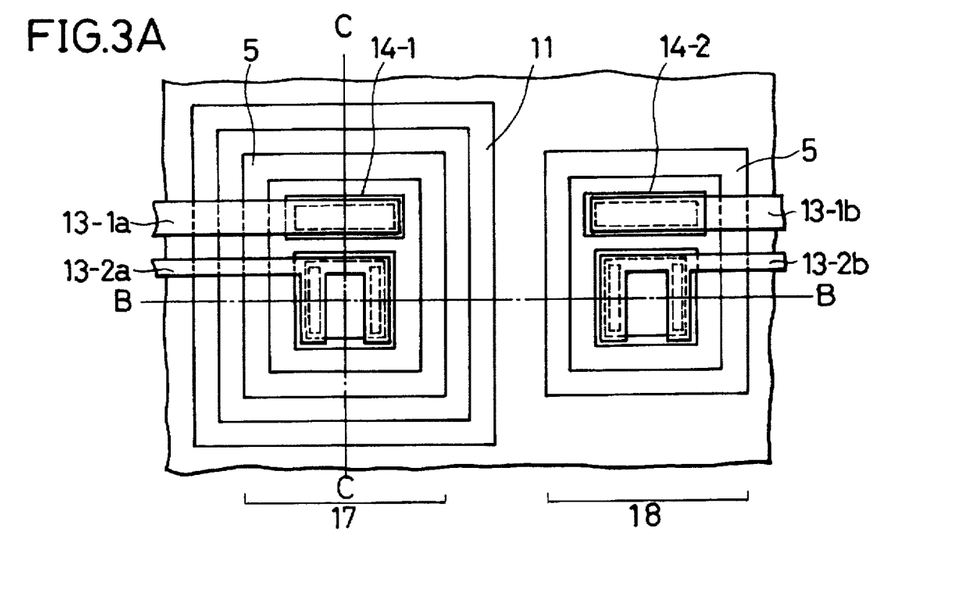
FIG. 3A is a plan view of an optical semiconductor device in accordance with the first embodiment of the present invention.
Figure 3B:
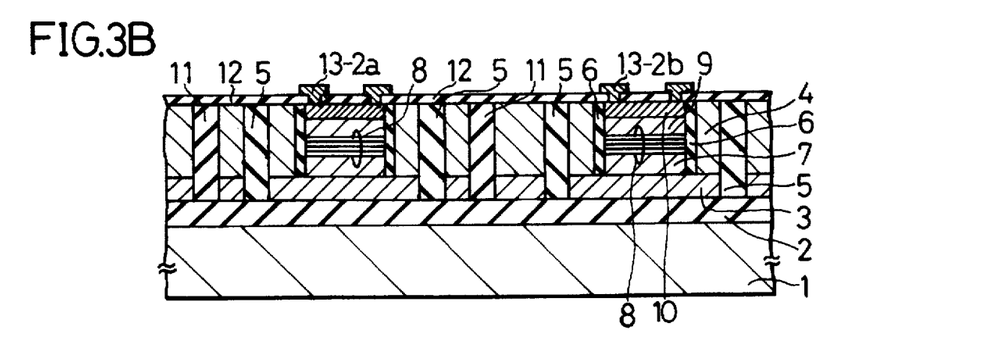
FIG. 3B is a cross-sectional view taken along the line B—B in FIG. 3A.
Figure 3C:
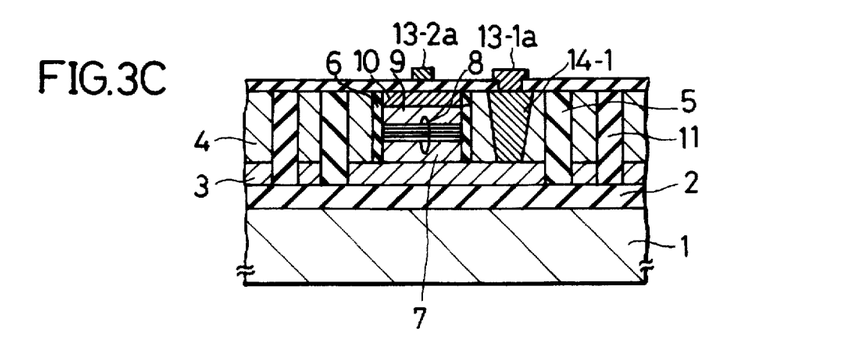
FIG. 3C is a cross-sectional view taken along the line C—C in FIG. 3A.

An optical semiconductor device in accordance with the first embodiment of the present invention, illustrated in FIGS. 3A to 3C, includes a light-emitting device 17 and a light-receiving device 18. Since the light-emitting device 17 and light-receiving device 18 have the same structure, hereinbelow only the light-emitting device 17 is explained.

The light-emitting device 17 includes a semiconductor substrate having an SOI region comprising a silicon substrate 1 as a first semiconductor layer, a buried silicon dioxide film 2 as a first insulating layer, formed on the silicon substrate 1, an N+ type buried layer 3 as a highly doped, second semiconductor layer, formed on the buried silicon dioxide film 2, and an N type epitaxial layer 4 as a third semiconductor layer, formed on the N+ type buried layer 3, all of which layers and film are deposited one on another. The buried silicon dioxide film 2 as a first insulating layer is designed to have a different index of refraction from that of the silicon substrate 1.

The light-emitting device 17 further includes a rectangular frame-shaped device isolation region 5 having a depth starting at an upper surface of the N type epitaxial layer 4 and terminating at an upper surface of the buried silicon dioxide film 2. The device isolation region 5 defines a device formation region (not referenced) therein. Within the device formation region there is formed a recess 22 (Not illustrated in FIGS. 3A to 3C. See FIG. 4C.) starting at an upper surface of the N type epitaxial layer 4 and terminating at an upper surface of the N+ type buried layer 3. An inner wall of the recess 22 is covered with a silicon dioxide layer 6 as a second insulating layer, as illustrated in FIGS. 3B and 3C.

The recess 22 is occupied with a multi-layered structure which includes a non-doped silicon epitaxial layer 7 as a first buffer layer, formed on the N+ type buried layer 3, an Si/Si$_{0.65}$Ge$_{0.35}$ super lattice layer 8, a non-doped silicon buffer layer 9 as a second buffer layer, and a P+ contact layer 10, all of which are deposited on this order. Herein, the Si/Si$_{0.65}$Ge$_{0.35}$ super lattice layer 8 is a multi-quantum well layer including a 32 nm-thick Si layer and ten 6 nm-thick Si$_{0.65}$Ge$_{0.35}$ layers.

As illustrated in FIG. 3C, the light-emitting device 17 includes an N+ type diffusion layers 14-1 as a connection region. Similarly, as illustrated in FIG. 3A, the light-receiving device 18 is formed with an N+ type diffusion layers 14-2 as a connection region. The N+ type diffusion layer 14-1 has a depth starting at an upper surface of the N type epitaxial layer 4 and terminating at an upper surface of the N+ type buried layer 3.

There is formed a light-impermeable region 11 which entirely surrounds the device isolation region 5, namely which is located intermediate between the light-emitting and light-receiving devices 17 and 18. The light-impermeable region 11 has a depth starting at an upper surface of the N type epitaxial layer 4 and terminating at an upper surface of the buried silicon oxide layer 2. In this embodiment, the light-impermeable region 11 is rectangular frame-shaped, similarly to the device isolation region 5.

The optical semiconductor device is covered at an upper surface thereof with a silicon dioxide film 12 as a third insulating layer. First electrodes 13-1a and 13-1b are formed on and in electrical connection with the N+ type diffusion layers 14-1 and 14-2 through the silicon dioxide layer 12, respectively. Second electrodes 13-2a and 13-2b are formed on and in electrical connection with the P+ type contact layer 10 through the silicon dioxide film 12.

As mentioned earlier, the light-receiving device 18 has the same structure as the above mentioned structure of the light-emitting device 17, and is optically isolated by the light-impermeable region 11. The light-emitting device 17 emits light when a voltage, which is positive when measured on the basis of a voltage of the first electrode 13-1a, is applied to the second electrode 13-2a. Similarly, the light-receiving device 18 absorbs lights when a voltage, which is negative when measured on the basis of a voltage of the first electrode 13-1b, is applied to the second electrode 13-2b.

A method of fabricating the above mentioned optical semiconductor device is explained hereinbelow with reference to FIGS. 4A to 4E.

Figure 4A:
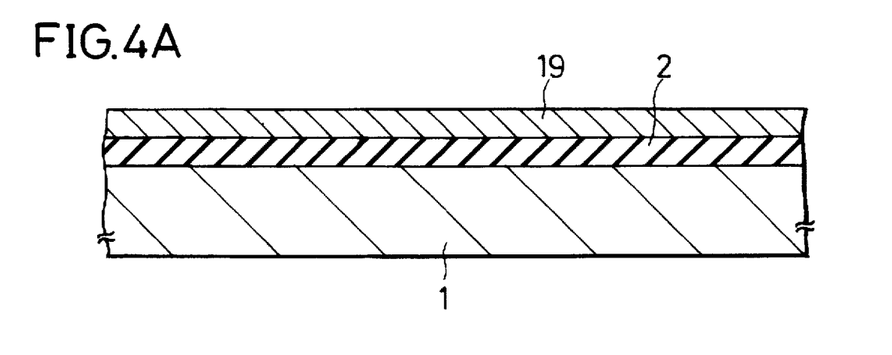
FIGS. 4A to 4E are cross-sectional views of an optical semiconductor device in accordance with the first embodiment of the present invention, illustrating respective steps of a method of fabricating the same.

First, as illustrated in FIG. 4A, there is formed an SOI substrate including the buried silicon dioxide film 2 therein, employing the silicon substrate 1 as a support substrate, by cladding technique, for instance. An SOI layer 19 formed on the buried silicon dioxide film 2 has a thickness of 1.5 µm, and the buried silicon dioxide film has a thickness of 0.2 µm.

Figure 4B:
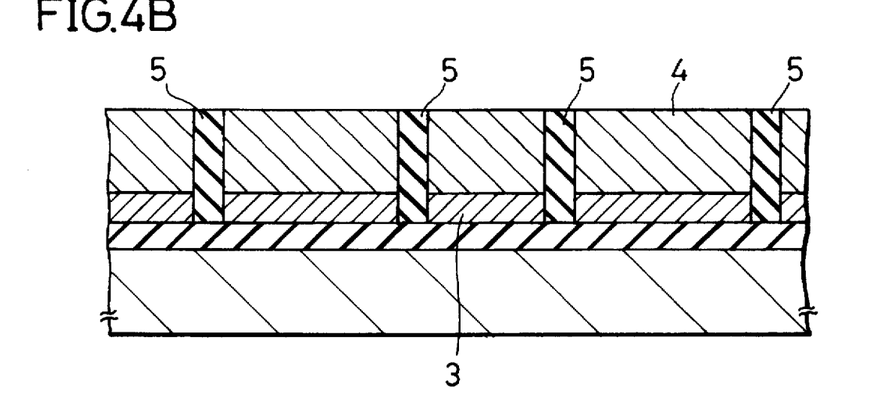

Then, the SOI layer 19 is implanted at a dose of about $5 \times 10^{15}$ cm$^{-2}$ arsenic (As) to thereby turn the SOI layer 19 into the N+ type buried layer 3. Then, the N type epitaxial layer 4 is formed by a thickness of 3 µm on the N+ type buried layer 3 by silicon epitaxial growth. Then, the silicon substrate 1 is etched so that there are formed a trench having a depth starting at an upper surface of the N type epitaxial layer 4 and terminating at an upper surface of the buried silicon dioxide film 2. Then, the trench is filled, for instance, with silicon dioxide to thereby form the rectangular frame-shaped device isolation region 5, as illustrated in FIG. 4B. Then, the N type epitaxial layer 4 is implanted at a dose of about $5 \times 10^{15}$ cm$^{-2}$ phosphorus (P) followed by annealing to thereby form the N+ type diffusion layers 14-1 and 14-2 having a depth starting at an upper surface of the N type epitaxial layer 4 and terminating at an upper surface of the N+ type buried layer 3, as illustrated in FIG. 3C (the layer 14-2 is illustrated in FIG. 3A). As mentioned later, electrodes for N regions will be formed on the N+ type diffusion layers 14-1 and 14-2.

Figure 4C:
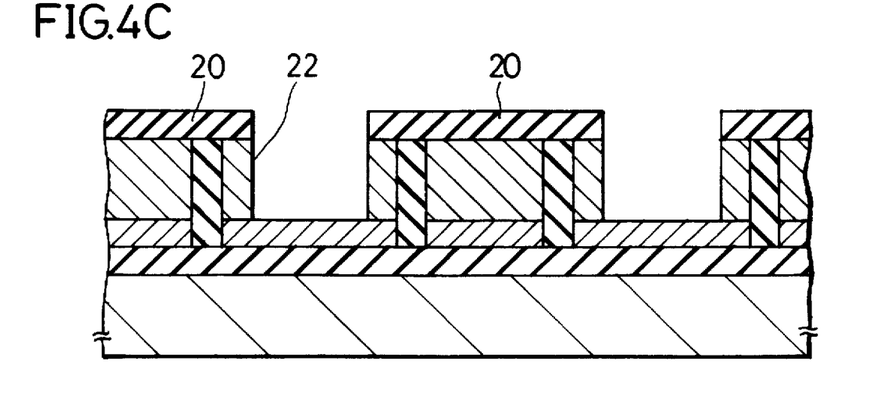

Then, as illustrated in FIG. 4C, a silicon dioxide film 20 is formed by growth over a surface of a resultant, and then is patterned so that two rectangles corresponding to shapes of the light-emitting and light-receiving devices 17 and 18 are open in the silicon dioxide film 20. Then, silicon etching is carried out with the patterned silicon dioxide film 20 being used as a mask to thereby form recesses 22 having a depth reaching an upper surface of the N+ type buried layer 3.

Figure 4D:
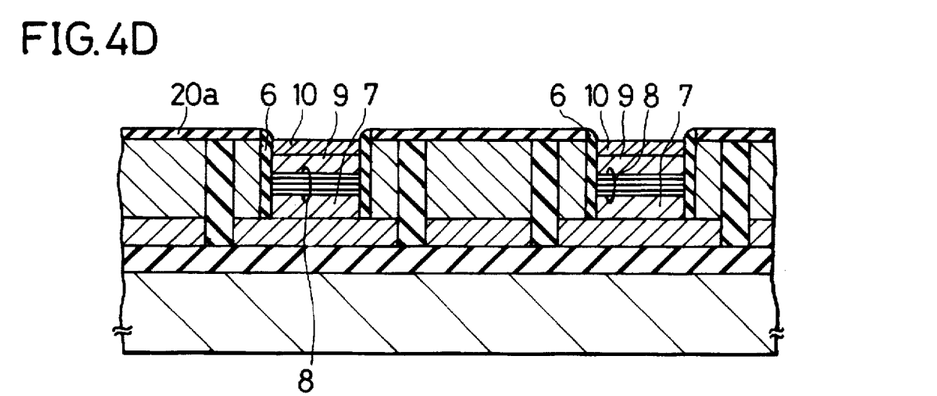

Then, as illustrated in FIG. 4D, a resultant is entirely covered with a silicon dioxide film, which is in turn etched back to thereby make the silicon dioxide layer 6 covering inner sidewalls of the recesses 22. Then, there are formed the non-doped silicon buffer layer 7 in the recesses 22 by epitaxial growth without intentional doping of impurities. The non-doped silicon layers 7 have a thickness of 1 µm. Then, a 32 nm-thick Si layer is made grown at 800 Pa at 700° C., and ten 6 nm-thick $Si_{0.65}Ge_{0.35}$ layers are made grown at 625° C. to thereby form the $Si_{0.65}Ge_{0.35}$ quantum well layer 8 on the non-doped silicon layer 7. Subsequently, the non-doped silicon buffer layer 9 is formed by 1 µm thickness on the quantum well layer 8, and then the P+ type contact layer 10 is formed on the non-doped silicon buffer layer 9. The P+ type contact layer 10 is implanted at a dose of about $1 \times 10^{20}$ cm$^{-3}$ boron (B). Thus, there is completed a diode having a structure which can be approximated by p-i-n.

Figure 4E:
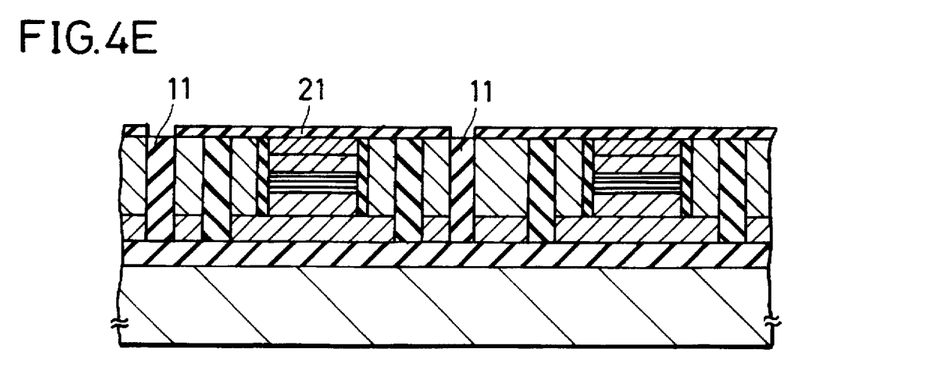

After removing both the silicon dioxide film 20a remaining non-etched on an upper surface of a resultant and a portion of the silicon dioxide film 6, as illustrated in FIG. 4E, a silicon dioxide film 21 is newly formed all over a resultant. Then, a resultant is patterned so that a frame-shaped open area is formed outside the device isolation region, followed by silicon etching so that there is formed a trench having a depth starting at an upper surface of the N type epitaxial layer 4 and terminating at an upper surface of the buried silicon dioxide film 2. Then, a tungsten film is deposited all over a resultant followed by etching back to thereby form the light-impermeable region 11. As illustrated in FIG. 3A, the light-impermeable region 11 is a frame-shaped region surrounding the device isolation region 5.

After the silicon dioxide film 21 is all removed, the silicon dioxide film 12 (see FIGS. 3B and 3C) is formed all over a resultant by a thickness in the range of 0.20 µm to 0.25 µm both inclusive.

Reflectance and transmission of a light entering a certain material is dependent on an index of refraction of the material. In addition, the reflectance and transmission is further dependent on a thickness of the material. First, suppose a case wherein a light perpendicularly enters a silicon substrate on which a silicon dioxide film is formed. Herein, indexes of refraction of a silicone dioxide film and silicon are 1.45 and 3.44, respectively.

Figure 5A:
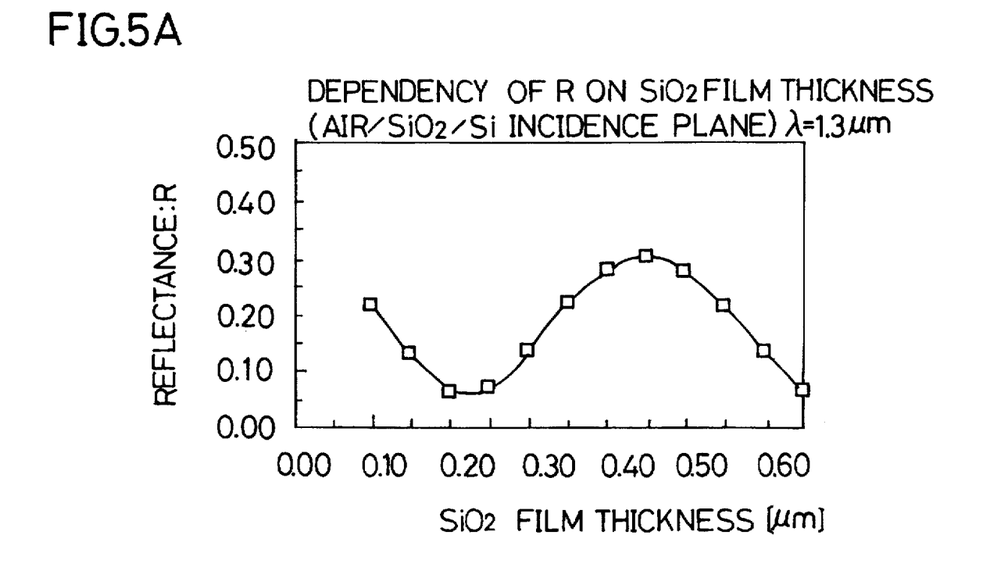
FIG. 5A is a graph showing a relationship between a thickness and reflectance of the third insulating layer.

As is understood in FIG. 5A, it is a range of about 0.15 µm to 0.30 µm in a thickness of a silicon dioxide film that a light having a wavelength of 1.3 µm enters efficiently, and in particular it is a range of about 0.20 µm to 0.25 µm in a thickness of a silicon dioxide film that a light having a wavelength of 1.3 µm enters the most efficiently. This shows that a silicon dioxide film having a thickness in such a range is suitable for introducing a light into a device therethrough. The above discussion is applied to a light-receiving device into which a light enters through an optical fiber. Namely, it is preferable for the silicon dioxide film 12 covering a resultant to have a thickness in the range of about 0.15 µm to about 0.30 µm both inclusive, and more preferably in the range of about 0.20 µm to about 0.25 µm both inclusive.

Figure 5B:
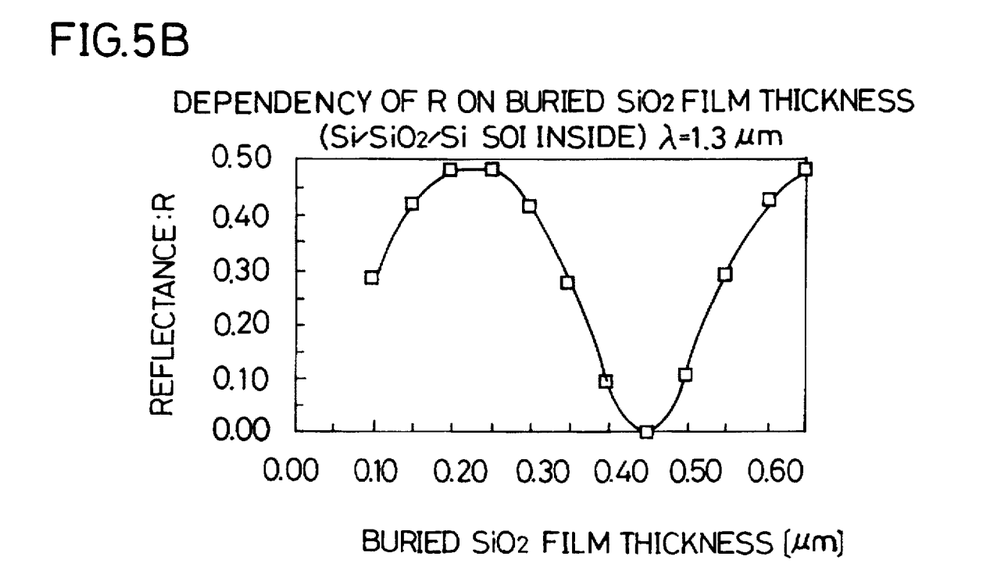
FIG. 5B is a graph showing a relationship between a thickness and reflectance of the first insulating layer.

Next, suppose a case wherein a light perpendicularly enters a silicon dioxide film buried in silicon. As shown in FIG. 5B, it is a range of about 0.15 µm to about 0.30 µm in a thickness of a silicon dioxide film that a light having a wavelength of 1.3 μm reflects to a great extent, and in particular it is a range of about 0.20 μm to about 0.25 μm in a thickness of a silicon dioxide film that a light having a wavelength of 13 μm reflects to the greatest extent. This shows a buried silicon dioxide film is required to have a thickness in such a range in order to prevent a light from passing therethrough to an underlying silicon substrate. A light downwardly emitted is reflected by about 40% when a buried silicon dioxide film has a thickness in the range of 0.15 μm to 0.30 μm, or by about 50% when a buried silicon dioxide film has a thickness in the range of 0.20 μm to 0.25 μm, and thus it is possible to increase an amount of light upwardly going by setting a thickness of a buried silicon dioxide film in the above mentioned range. The above discussion is applied to a light-emitting device upwardly emitting a light. In addition, a thickness of a buried silicon dioxide film in the above mentioned range makes it possible to improve electricity-light transfer efficiency in a light-receiving device, because a light having entered a light-receiving device but passing through the light-receiving device to underlying layers without being transferred to electricity can be reflected back to the Si/Si$_{0.65}$Ge$_{0.35}$ super lattice layer 8. Thus, it is preferable for the buried silicon dioxide film 2 to have a thickness in the range of about 0.15 μm to about 0.30 μm both inclusive, and more preferably in the range of about 0.20 μm to about 0.25 μm both inclusive.

In accordance with the above mentioned embodiment, the light-emitting and light-receiving devices 17 and 18 both have a planar structure, and hence are congenial to fabrication processes of internal integrated circuits, resulting in that light-emitting and light-receiving devices and internal integrated circuits can be formed on a common chip. That is, the reduction in costs for the formation of Si-OEIC can be accomplished.

In addition, since light-emitting and light-receiving devices are formed on an SOI substrate, the buried silicon dioxide film 2 reflects a light coming down thereto. In particular, if the buried silicon dioxide film 2 is designed to have a thickness in the range of 0.20 μm to 0.25 μm, a light emitted to the light-emitting device is reflected by about 50%. Thus, the light-emitting device is able to emit a greater amount of light with the result of improvement in an electricity-light transfer efficiency.

In the above mentioned embodiment, the light-impermeable region 11 is formed so as to surround the light-emitting device 17. Hence, it is possible to prevent a light emitted from the light-emitting device 17 from spreading directly to the light-receiving device 18, resulting in the reduction of noises.

Figure 6A:
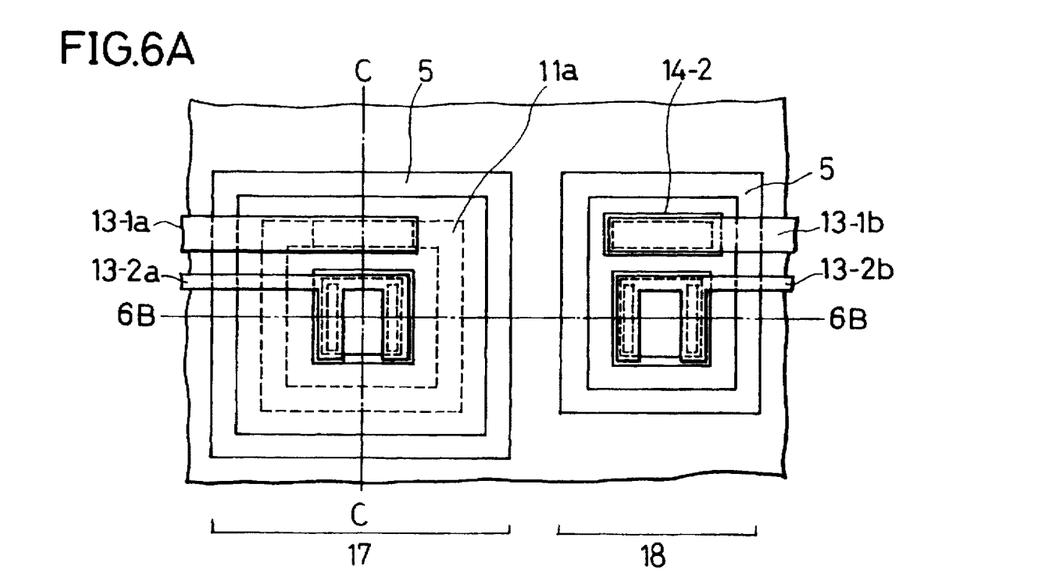
FIG. 6A is a plan view of an optical semiconductor device in accordance with the second embodiment of the present invention.
Figure 6B:
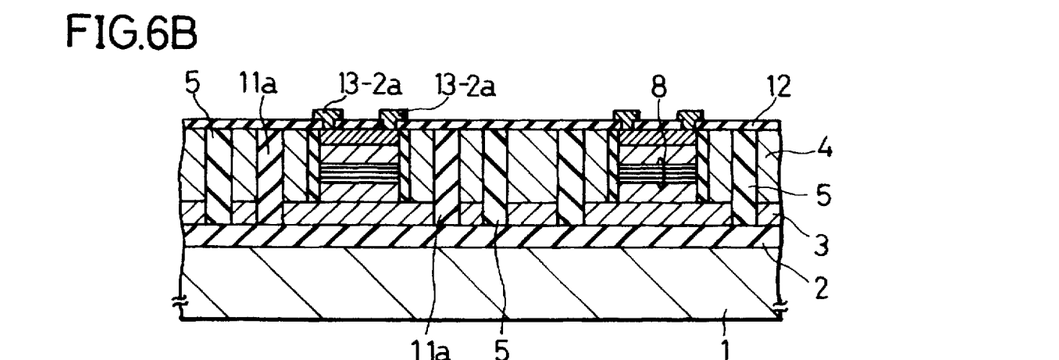
FIG. 6B is a cross-sectional view taken along the line B—B in FIG. 6A.
Figure 6C:
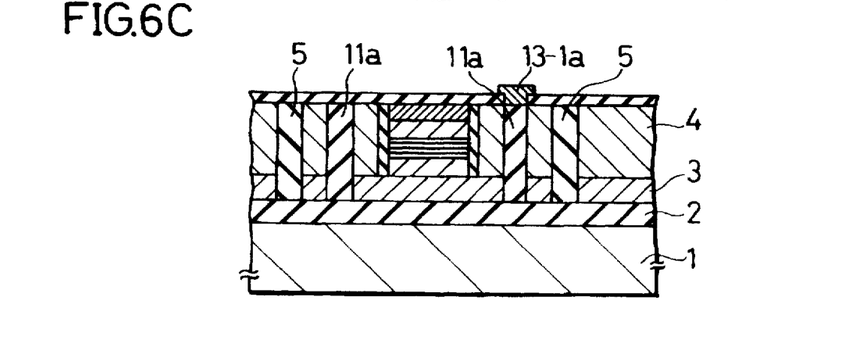
FIG. 6C is a cross-sectional view taken along the line C—C in FIG. 6A.

An optical semiconductor device in accordance with the second embodiment is explained hereinbelow with reference to FIGS. 6A to 6C.

The light-impermeable region 11 is positioned between the device formation regions for the light-emitting device 17 and the light-receiving device 18 in the above mentioned embodiment, whereas the light-impermeable region 11a is positioned inside the device formation region for the light-emitting device 17 and acts also as a connection region for connecting the first electrode 13-1a with the N+ type buried layer 3. Hence, the second embodiment does not include a connection region such as the connection region 14-1 in the first embodiment.

With respect to the light-receiving device 18, it is possible to form the first electrode 13-1b on the light-impermeable region 11a without the formation the N+ type diffusion layer 14-2.

Since the light-emitting device 17 in the second embodiment has a larger area than the light-emitting device 17 in the first embodiment, the light-emitting device 17 in the second embodiment has to have a greater capacity, and hence is disadvantageous in high-speed response. However, it is no longer necessary in the second embodiment to form the N+ type diffusion layers 14-1 and 14-2 unlike the first embodiment, resulting in an advantage of shortening fabrication time. In addition, the light-impermeable region 11a acting also as a connection region has a smaller resistance than that of the N+ type diffusion layer 14-1.

In the above mentioned first and second embodiments, those skilled in the art would readily understand that conductivity of elements and polarity of applied voltages may be opposite to those described above.

The buried silicon dioxide film 2 as the first insulating layer is formed all over the silicon substrate 1 as the first semiconductor layer in the above mentioned first and second embodiment, however, it should be noted that the buried silicon dioxide film 2 may be partially formed over the silicon substrate 1 unless the buried silicon dioxide film 2 is formed below the multi-layered structure including the Si/Si$_{0.65}$Ge$_{0.35}$ super lattice layer 8.

The light-impermeable regions 11 and 11a may be formed of any other metal than tungsten, unless the metal is refractory.

In addition, the silicon substrate 1, the N+ type buried layer 3 and the N type epitaxial layer 4 as the first, second and third semiconductor layers may be made of single crystal silicon.

Hereinbelow are explained variants of the first and second embodiments.

Figure 7:
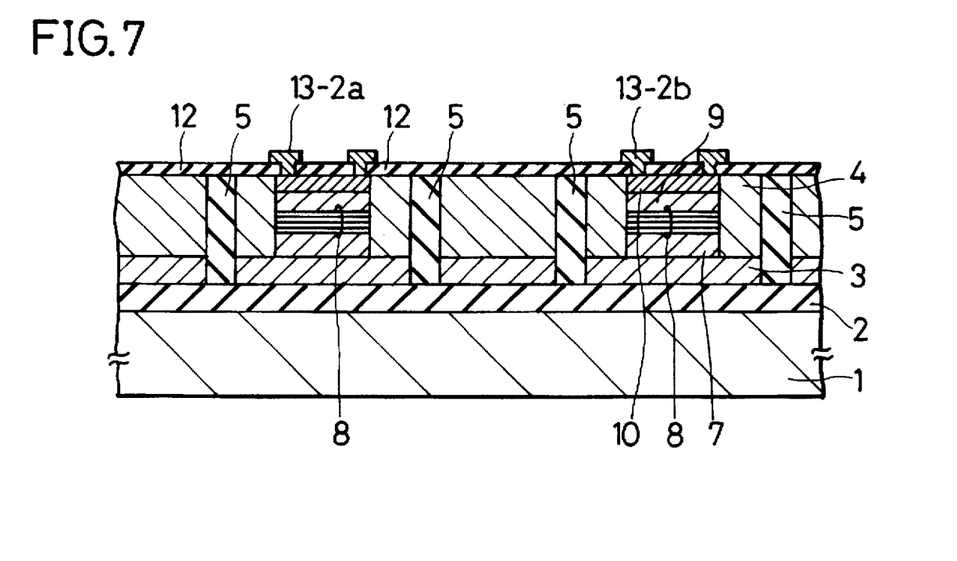
FIG. 7 is a cross-sectional view of an optical semiconductor device in accordance with the first variant of the first embodiment.

FIG. 7 is a cross-sectional view of an optical semiconductor device in accordance with the first variant of the first embodiment. The illustrated optical semiconductor device is almost the same as the first embodiment, but different in that the silicon dioxide film 6 as the second insulating layer and the light-impermeable regions 11 and 11a are not formed. However, the optical semiconductor device illustrated in FIG. 7 is designed to include the buried silicon dioxide film 2.

The buried silicon dioxide film 2 as the first insulating layer sandwiched between the silicon substrate 1 and the N+ buried layer 3 acts as a reflection layer, and hence it is possible to improve an electricity-light transfer efficiency in the light-emitting device 17.

The optical semiconductor device illustrated in FIG. 7 may further include the silicon dioxide film 6 as the second insulating film or the light-impermeable regions 11 and 11a.

Figure 8:
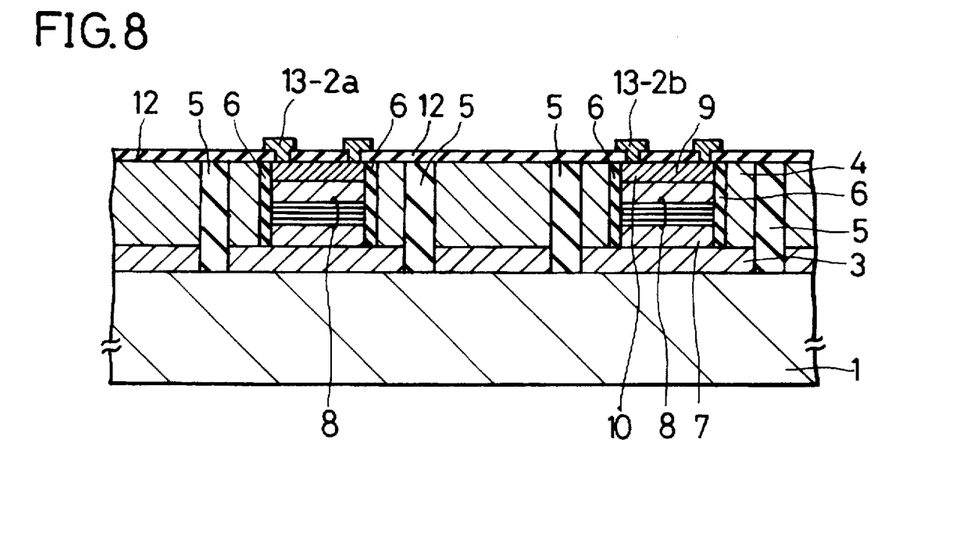
FIG. 8 is a cross-sectional view of an optical semiconductor device in accordance with the second variant of the first embodiment.

FIG. 8 is a cross-sectional view of an optical semiconductor device in accordance with the second variant of the first embodiment. The illustrated optical semiconductor device is almost the same as the first embodiment, but different in that the buried silicon dioxide film 2 as the first insulating layer and the light-impermeable regions 11 and 11a are not formed. However, the optical semiconductor device illustrated in FIG. 8 is designed to include the silicon dioxide film 6.

Since the multi-layered structure is formed in the recess an inner wall of which is covered with the silicon dioxide film 6, both the first and second electrodes can be formed at a surface of the optical semiconductor device, namely a planar-structured optical semiconductor device can be obtained.

The optical semiconductor device illustrated in FIG. 8 may further include the light-impermeable regions 11 and 11a.

Figure 9:
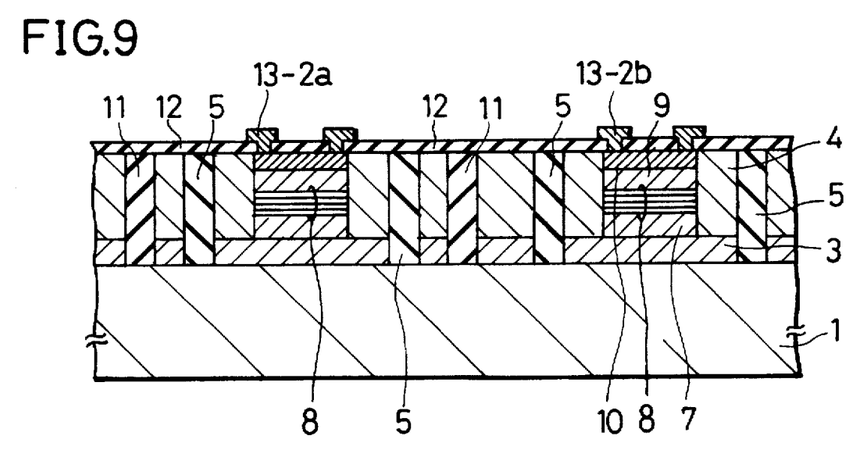
FIG. 9 is a cross-sectional view of an optical semiconductor device in accordance with the third variant of the first embodiment.

FIG. 9 is a cross-sectional view of an optical semiconductor device in accordance with the third variant of the first embodiment. The illustrated optical semiconductor device is almost the same as the first embodiment, but different in that the buried silicon dioxide film 2 as the first insulating layer and the silicon dioxide film 6 as the second insulating layer are not formed. However, the optical semiconductor device illustrated in FIG. 9 is designed to include the light-impermeable regions 11 and 11a.

The light-impermeable regions 11 and 11a avoid light reflection between a sidewall of the multi-layered structure and other devices formed on a common chip. Thus, the light-impermeable regions 11 and 11a provide greater light reflection efficiency, resulting in improvement in an electricity-light transfer efficiency in the light-emitting device 17.

The present invention described with reference to the preferred embodiments provides many advantages.

First, it is possible to form an optical semiconductor device on a semiconductor substrate including an SOI region which device has a planar structure and includes a quantum well layer acting as an active layer, resulting in OEIC which is able to be readily integrated, improvement in electricity-light transfer efficiency in a light-emitting device, and improvement in light-electricity transfer efficiency in a light-receiving device. This is because a light reflectance can be enhanced by causing the first insulating layer located in SOI region to have a thickness which is determined in dependence on reflectance against the second semiconductor layer with respect to a light having a wavelength associated with the quantum well layer.

Secondly, it is possible to reduce noises to the light-receiving device by forming the light-impermeable region filled with refractory metal such as tungsten outside or inside the light-emitting device. This is because a light emitted from the light-emitting device is absorbed into the light-impermeable region and hence cannot reach the light-receiving device.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-105600 filed on Apr. 25, 1996 including specification, claims, drawings and summary is incorporated herein by reference in its entirety.

What is claimed is:

1. An optical semiconductor device, comprising:

(a) a first semiconductor layer;

(b) a first insulating layer formed on said first semiconductor layer, said first insulating layer having a different index of refraction from that of said first semiconductor layer;

(c) a highly doped, second semiconductor layer having a first conductivity and formed on said first insulating layer;

(d) a third semiconductor layer having a first conductivity and formed on said second semiconductor layer;

(e) a device isolation region having a depth starting at an upper surface of said third semiconductor layer and terminating at an upper surface of said first insulating layer, said device isolation region defining a device formation region therein, said device formation region being formed with a recess starting at an upper surface of said third semiconductor layer and terminating at an upper surface of said second semiconductor layer;

(f) a multi-layered structure formed within said recess, said multi-layered structure having at least a quantum well layer and a contact layer formed on said quantum well layer and having a second conductivity;

(g) a connection region having a depth starting at an upper surface of said third semiconductor layer and terminating at an upper surface of said second semiconductor layer;

(h) a first electrode formed on and in electrical connection with said connection region; and (i) a second electrode formed on and in electrical connection with said contact layer.

2. The optical semiconductor device as set forth in claim 1, wherein said first insulating layer has a thickness determined in dependence on reflectance against said second semiconductor layer with respect to a light having a wavelength associated with said quantum well layer.

3. The optical semiconductor device as set forth in claim 1, wherein said first insulating layer has a thickness in the range of 0.15 μm to 0.30 μm both inclusive.

4. The optical semiconductor device as set forth in claim 1, wherein said first insulating layer has a thickness in the range of 0.20 μm to 0.25 μm both inclusive.

5. The optical semiconductor device as set forth in claim 1, wherein said first insulating layer is formed all over said first semiconductor layer.

6. The optical semiconductor device as set forth in claim 1, wherein said first insulating layer is formed at least below said multi-layered structure.

7. The optical semiconductor device as set forth in claim 1 further comprising a second insulating layer covering an inner sidewall of said recess therewith.

8. The optical semiconductor device as set forth in claim 1 further comprising a light-impermeable region having a depth starting at an upper surface of said third semiconductor layer and terminating at an upper surface of said first insulating layer, said light-impermeable region being formed outside said recess.

9. The optical semiconductor device as set forth in claim 8, wherein said light-impermeable region is formed outside said device formation region.

10. The optical semiconductor device as set forth in claim 8, wherein said light-impermeable region is formed inside said device formation region.

11. The optical semiconductor device as set forth in claim 10, wherein said light-impermeable region is made of metal to act as a connection region, in which case said connection region is not formed.

12. The optical semiconductor device as set forth in claim 11, wherein said light-impermeable region is made of refractory metal.

13. The optical semiconductor device as set forth in claim 12, wherein said refractory metal is tungsten.

14. The optical semiconductor device as set forth in claim 1 further comprising a third insulating layer covering a resultant therewith, said first and second electrodes appearing outside through said third insulating layer.

15. The optical semiconductor device as set forth in claim 14, wherein said third insulating layer has a thickness in the range of 0.15 μm to 0.30 μm both inclusive.

16. The optical semiconductor device as set forth in claim 15, wherein said third insulating layer has a thickness in the range of 0.20 μm to 0.25 μm both inclusive.

* * * * *